United States Patent [19]
Gelbart

[11] Patent Number: 5,861,992
[45] Date of Patent: Jan. 19, 1999

[54] MICROLENSING FOR MULTIPLE EMITTER LASER DIODES

[75] Inventor: Daniel Gelbart, Vancouver, Canada

[73] Assignee: Creo Products Inc, Burnaby, Canada

[21] Appl. No.: 879,816

[22] Filed: Jun. 20, 1997

[51] Int. Cl.$^6$ ................................................. G02B 27/10
[52] U.S. Cl. ........................ 359/619; 359/623; 359/813; 359/321; 359/708; 347/241; 250/578.1
[58] Field of Search ................................ 359/619, 813, 359/321, 254, 259, 41, 326, 623, 708; 347/241; 250/578.1

[56] References Cited

U.S. PATENT DOCUMENTS

| | | | |
|---|---|---|---|
| 4,962,983 | 10/1990 | Watanabe | 250/578.1 |
| 5,420,722 | 5/1995 | Bielak | 359/708 |
| 5,517,359 | 5/1996 | Gelbart | 359/623 |
| 5,521,748 | 5/1996 | Sarraf | 359/321 |
| 5,619,245 | 4/1997 | Kessler et al. | 347/241 |

Primary Examiner—Loha Ben

[57] ABSTRACT

A microlens for a multiple emitter laser diode consists of narrow slices cut out from molded aspheric lenses. Each slice is mounted in front of one emitter and the slice position is adjusted in the cross-emitter direction to have all emitter images aligned in a straight line, thus compensating for any lack of straightness in the multiple emitter diode.

8 Claims, 2 Drawing Sheets

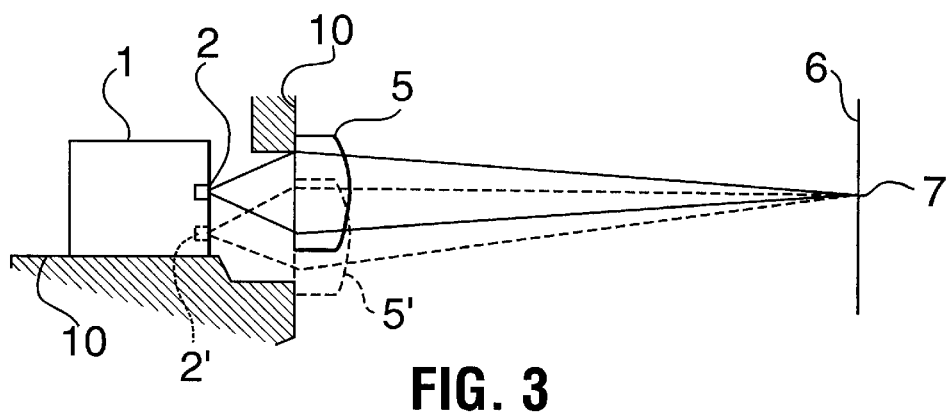
FIG. 3
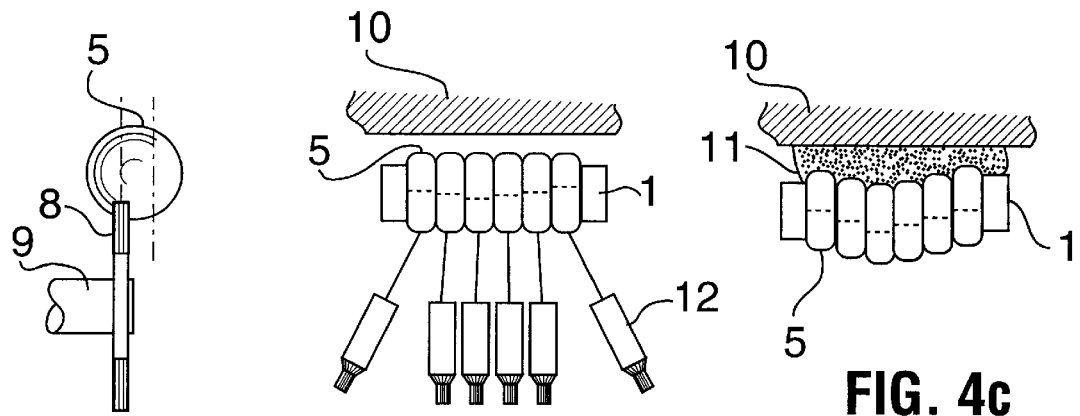
FIG. 4a     FIG. 4b     FIG. 4c

MICROLENSING FOR MULTIPLE EMITTER LASER DIODES

FIELD OF THE INVENTION

The present invention relates to laser diodes, and in particular to laser diodes consisting of a linear array of emitters. The term "microlensing" is commonly used to mean mounting miniature lenses in close proximity to the laser diode in order to reduce divergence.

BACKGROUND OF THE INVENTION

Many high power laser diodes consist of a linear array of emitters. As the emitters have to be separated for thermal and optical reasons, it is not uncommon to have the emitter array extend beyond 10 mm. When mounting such an array onto a heat sink it is difficult to keep it flat, thus the emitters are no longer in a straight line. This deviation from straightness is known in the art as "smile". For a 10 mm wide diode the "smile" is typically from 1 to 10 microns. Due to the high divergence angle of laser diodes the focal length of the coupling lenses used (known as "microlenses") is very short. When a cylindrical lens is used as a fast axis microlens, as shown in FIG. 1, the slightest deviation from straightness prevents the image of the emitters from forming a straight line (or overlapping lines). For example, in FIG. 1 when using a cylindrical lens 4, having a focal length of about 1 mm, a 10 micron "smile" will cause the images of the emitters to bow by 1 mm when projected 100 mm from diode. Prior art methods such as U.S. Pat. No. 5,619,245 attempt to correct the "smile" by optical means, requiring extra optical elements and increasing the numerical aperture of the optics. The present invention corrects the "smile" in a simple manner. Other prior art, such as U.S. Pat. No. 5,420,722 bend the cylindrical lens to match the straightness error of the laser diode. Bending the microlens can provide corrections for simple deviations from straightness but not for complex curves.

SUMMARY OF THE INVENTION

According to the invention there is provided an apparatus for aligning light emitted from a multiple emitter diode onto an image medium. The apparatus includes a plurality of emitters positioned so as to emit a pattern of light and a plurality of microlenses, each microlens individually positioned and aligned in front of a corresponding one of the emitters. The microlenses are oriented so as to focus light from emitters onto the image medium in an altered pattern selectively modified from the pattern of light emitted by emitters. The present invention mechanically adjusts the optical center of the microlenses to align with laser diode emitters. This is achieved by dividing the microlens into segments, each segment individually aligned with an emitter. This allows one to correct any deviation from straightness. A second advantage of the individual lenslets is that they can be cut out from molded aspheric lenses, providing a much higher degree of correction of optical aberrations than can a combination of cylindrical lenses. The invention is equally useful for a linear array of emitters all wired in parallel and acting as one high power diode, or for a linear array of individually addressable emitters.

BRIEF DESCRIPTION OF THE DRAWINGS

FIG. 3 is a cross sectional view illustrating the principle of straightness correction.

FIGS. 4a, 4b and 4c show in elevation the steps "a", "b" and "c" required to reduce the present invention to practice.

DETAILED DESCRIPTION OF THE INVENTION

Figure 1:
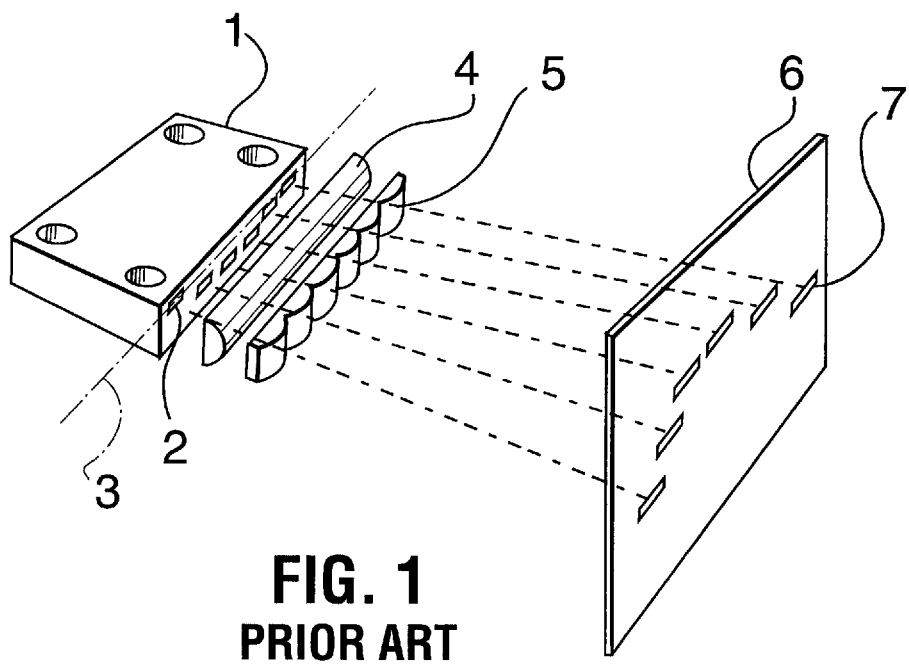
FIG. 1 is a perspective view of prior art microlensing illustrating the magnified deviation from straightness of the images of the emitters caused by the deviation from straightness of the emitters.
Figure 2:
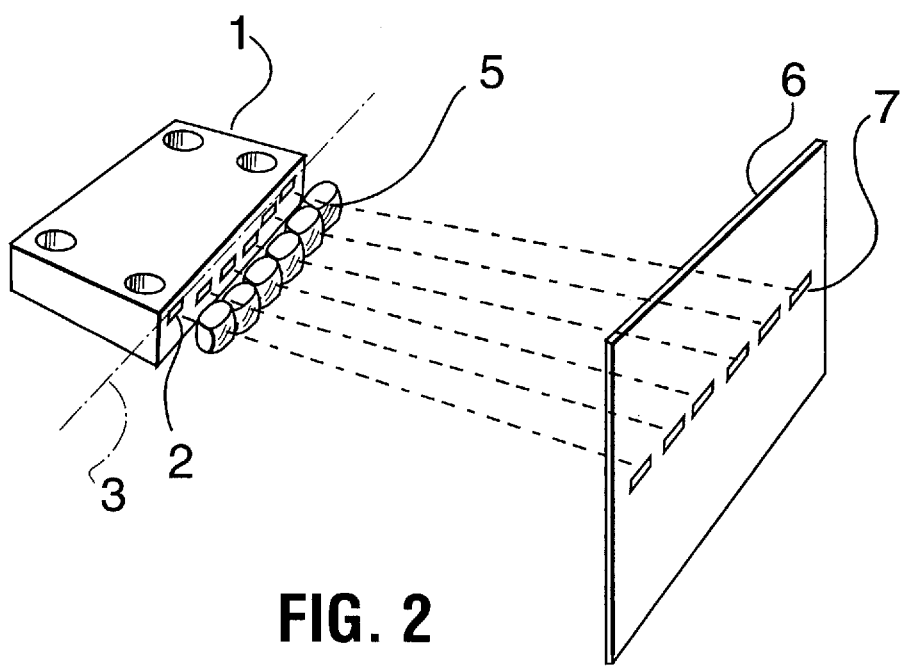
FIG. 2 is a perspective view of the invention, using individual lenslets arranged in accordance with the deviation from straightness of the emitters.

The invention will be described in connection with one preferred embodiment, however, it will be understood that it is not intended to limit the invention to this embodiment. It is intended to cover all alternatives, equivalents and modifications of the invention as defined in the appended claims. Referring now to the prior art shown in FIG. 1, a laser diode 1 consists of multiple emitters 2. The emitters form a bent line, deviating from the ideal straight line 3. Most of this bending, or "smile" is caused when soldering the laser diode wafer to the copper heat sink. When a straight cylindrical lens 4 is placed in front of the bent array of emitters, the straightness error is greatly magnified when projected as spots 7 on a plane 6 away from the diode. This error is not affected by the cylindrical lenses 5 which operate on the other axis of the beams. Referring now to FIG. 2, if the microlens is made of individual elements 5, one per emitter 2, and the position of elements 5 can be adjusted in a plane perpendicular to direction of emitted, light from the emitters form a straight line at any plane 6 by individually adjusting elements 5. A more detailed view of the adjustment is given in FIG. 3, which is a cross-sectional view of the microlensed array. Lens 5 forms an image 7 of emitter 2 on plane 6. If a second emitter is at a different elevation, shown as 2', lens element 5' which is used to image 2' has also to be at a different elevation than lens 5 in order to bring all spots 7 to the same elevation. Elements 5 and 5' rest on a reference surface 10, keeping them at the correct distance from 2 and 2'. Element 5' has to slide along reference surface 10 in order to overlap the image of element 2' with image of element 2, formed by element 5. FIG. 4 shows the details of making and mounting optical elements 5. Since the emitters in a laser diode are spaced typically under 1 mm from each other and the diameter of lens 5 is typically a few millimeters (to allow for a sufficient field-of-view, focal length and N.A.) it is not possible to fit round lenses to each emitter. The best manufacturing method for these lenses is hot molding of a glass preformed in an aspheric mold. These lenses are available with numerical apertures (NA) as high as 0.7 and aberration as low as 0.05 wavelength. This is a much higher quality than possible with cylindrical lenses, which are subject to fundamental trade-offs in the optical design. Major suppliers of molded aspheric lenses are Hoya (Japan), Kodak (Rochester, N.Y.) and Geltech (Alachua, Fla.). As all these lenses are produced in round molds, made by diamond turning, they are only available as round lenses. To convert them to lens elements 5, a slice is diamond-cut from the center of each molded aspheric lens. The cutting operation is shown in FIG. 4-a. A diamond impregnated blade 8 is mounted on precision arbor 9 and cuts lens 5 at two places, symmetrically located from lens center. Slices are cut to match the center spacing of emitters to create individual spots, or cut slightly thinner than the center spacing of the emitters to create overlapping spots as disclosed in U.S. Pat. 5,517,359. Lens elements 5 are arranged in a linear array in front of laser diode 1. Micro-manipulators 12 in FIG. 4-b are used to position slices 5 relative to the emitters of diode 1. Micro-manipulators 12 can be commercial units, available from suppliers of probing stations for semiconductors, or simply slender steel wires pushed by micrometers. Each element 5 is pushed into position while observing the image 7 of the emitter (shown in FIG. 2 and 3). When all images are in line, an adhesive 11 (FIG. 4-*c*) is used to permanently secure elements 5 to reference surface 10 and micro-manipulators 12 are removed.

EXAMPLE

To microlens a 20 W laser diode consisting of 19 elements on 650 micron spacing (Opto Power OPC-B020 from Opto Power, Tuscon, Ariz.), a molded aspheric microlens from Geltech Inc. (Alachua, Fla.) is used, part number 350140. Lenses are cut to 650 micron slices using a high speed diamond saw (made by Disco, Japan). An array of 19 micrometers pushing 0.3 mm steel wires is used as a micro-manipulator. A 30 minute epoxy mixed with fine glass powder is used as an adhesive (glass/epoxy ratio 1:1). Glass powder increases dimensional stability of epoxy and prevents it from creeping onto lens optical surfaces. The 10 micron straightness error of a typical diode was easily removed. Note that while the lens is cut into narrow slices, there is no loss of light as the divergence of the emitter is quite low (about 10° FWHM) in the array direction, thus the 0.65 mm×2 mm aperture of the slice is a good match for the 0.1×0.7 NA of the emitter. Optical coupling efficiency is over 80%.

What is claimed is:

1. Apparatus for aligning light emitted from a multiple emitter diode onto an image medium, the apparatus comprising:

a plurality of emitters aligned so as to form a slight departure from a linear array; and a plurality of microlenses, each microlens individually positioned and aligned in front of a corresponding one of said emitters, said microlenses oriented so as to focus light from said emitters onto an image medium in a linear pattern.

2. Apparatus according to claim 1, wherein said separate microlens is a slice out of a molded aspheric lens.

3. Apparatus according to claim 1, wherein each emitter is arranged substantially adjacent to another of said emitters, wherein each microlens is arranged substantially adjacent to another of said microlenses, and wherein said emitters and said microlenses are so dimensioned so that a width of each of said microlenses equals a center spacing between corresponding adjacent ones of said emitters and light from said emitters generates individual spots on said image medium.

4. Apparatus according to claim 1, wherein said emitters and said microlenses are dimensioned so that a width of each of said microlenses is less than a center spacing between corresponding adjacent ones of said emitters such that light from said emitters generates overlapping spots on said image medium.

5. Apparatus according to claim 1, wherein all of said emitters are electrically connected in parallel.

6. Apparatus according to claim 1, wherein each of said emitters can be switched on individually.

7. Apparatus for aligning light emitted from a multiple emitter diode onto an image medium, the apparatus comprising:

a frame;

a plurality of emitters coupled to said frame and positioned in a substantially linear array so as to emit a deviated pattern of light on an image medium that deviates from a straight line, each emitter arranged substantially adjacent to another one of said emitters; and a plurality of microlenses coupled to said frame, each microlens individually positioned and aligned in front of a corresponding one of said emitters, each microlens arranged substantially adjacent to another one of said microlenses, said microlenses oriented so as to focus light from said emitters onto the image medium in a linear pattern selectively modified from the deviated pattern of light emitted by said emitters.

8. A method of aligning emitted light from a multiple emitter diode having emitters arranged substantially linearly and emitting light so as to form a deviated image on an image medium that deviates from a straight line, comprising the steps of:

locating a plurality of microlenses so that each microlens is individually positioned and aligned in front of a corresponding one of said emitters; and orienting each of said microlenses so as to focus light from said emitters onto the image medium in a linear pattern selectively modified from the deviated image formed by said emitters.

* * * * *